United States Patent
Bains et al.

(10) Patent No.: US 8,468,433 B2
(45) Date of Patent: Jun. 18, 2013

(54) OPTIMIZING THE SIZE OF MEMORY DEVICES USED FOR ERROR CORRECTION CODE STORAGE

(75) Inventors: Kuljit S. Bains, Olympia, WA (US); Joe H. Salmon, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/359,163

(22) Filed: Jan. 26, 2012

(65) Prior Publication Data

US 2012/0124451 A1    May 17, 2012

Related U.S. Application Data

(63) Continuation of application No. 11/843,789, filed on Aug. 23, 2007, now Pat. No. 8,108,761.

(51) Int. Cl.
*H03M 13/00* (2006.01)

(52) U.S. Cl.
USPC .................. 714/784; 714/728; 714/763

(58) Field of Classification Search
USPC .............. 714/784, 728, 729, 782, 763, 718, 714/723
See application file for complete search history.

(56) References Cited

U.S. PATENT DOCUMENTS

| | | | |
|---|---|---|---|
| 5,276,832 A * | 1/1994 | Holman, Jr. | 711/3 |
| 7,379,316 B2 * | 5/2008 | Rajan | 365/63 |
| 8,127,199 B2 * | 2/2012 | Andersson | 714/762 |

* cited by examiner

*Primary Examiner* — Fritz Alphonse
(74) *Attorney, Agent, or Firm* — Blakely, Sokoloff, Taylor & Zafman LLP

(57) ABSTRACT

Embodiments of the invention are generally directed to systems, methods, and apparatuses for optimizing the size of memory devices used for error correction code storage. An apparatus (such as a memory module) may include a number of memory devices to store data and a memory device to store error correction (ECC) bits. In some embodiments, the memory devices to store data may have a density of N and the memory device to store ECC bits has a density of ½ N.

20 Claims, 5 Drawing Sheets

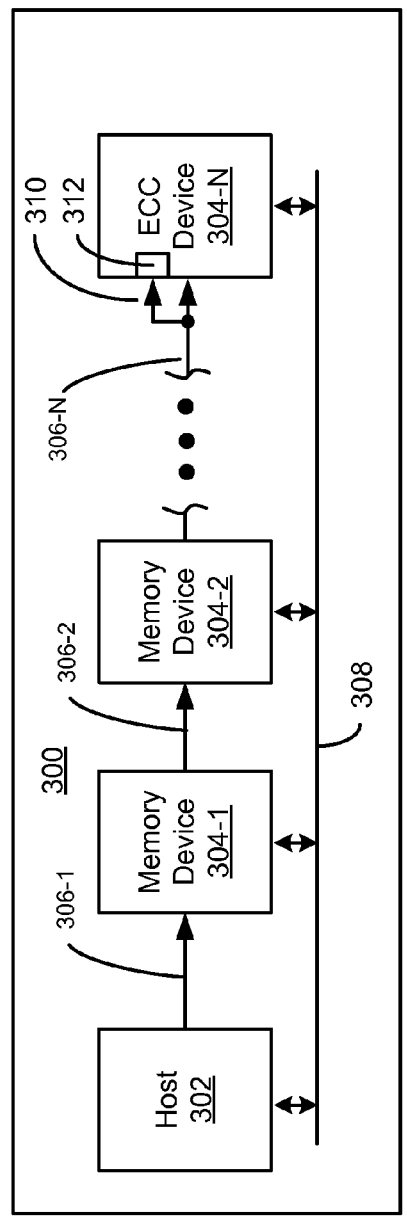
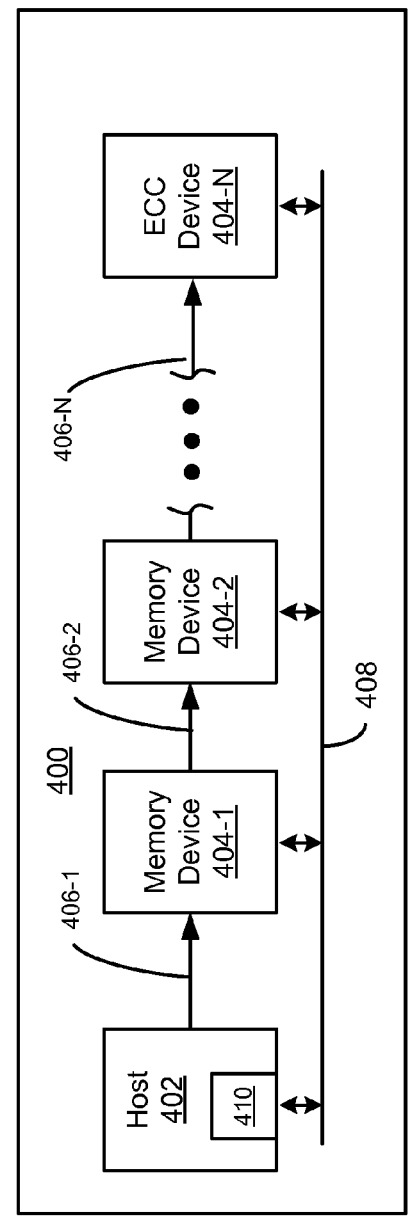

OPTIMIZING THE SIZE OF MEMORY DEVICES USED FOR ERROR CORRECTION CODE STORAGE

This application is a continuation of U.S. patent application Ser. No. 11/843,789, entitled OPTIMIZING THE SIZE OF MEMORY DEVICES USED FOR ERROR CORRECTION CODE STORAGE filed Aug. 23, 2007 now U.S. Pat. No. 8,108,761 and is hereby incorporated by reference.

TECHNICAL FIELD

Embodiments of the invention generally relate to the field of information technology and, more particularly, to systems, methods and apparatuses for optimizing the size of memory devices used for error correction code storage.

BACKGROUND

Typically, memory modules support an error correction code (ECC) by including an additional memory device on the module to store ECC bits. The term "ECC device" refers to the additional memory device that stores ECC bits. The term "data device" refers to the memory devices that store data rather than ECC bits. In general, the ECC device has the same density as the memory devices on the module. The term "density" refers to the storage capacity of a memory device.

In some cases, a significant fraction of the storage capacity of the ECC device is wasted. For example, the amount of memory that is wasted for a single sided dual inline memory module (DIMM) using x16 devices with a density of 1 Gbit is 64 Mbytes (or ½ of the capacity of a 128 Mbyte device). Table 1 illustrates the amount of wasted capacity of an ECC device for a 72 bit wide single sided DIMM using devices with various bit widths.

TABLE 1

| DIMM width in bits | Device width in bits | # of devices + # of ECC devices | ECC device width | ECC Memory wasted |
|---|---|---|---|---|
| 72 | x8 | 8 + 1 | x8 | No |
| 72 | x16 | 4 + 1 | x16 | Yes-½ |
| 72 | x32 | 2 + 1 | x32 | Yes-¾th |

As shown in Table 1, the amount of wasted capacity is significant. In addition, the amount of wasted capacity doubles as the density of the memory devices doubles.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 3 is a block diagram illustrating selected aspects of a memory system implemented according to an embodiment of the invention.

FIG. 4 is a block diagram illustrating selected aspects of a memory system implemented according to an alternative embodiment of the invention.

DETAILED DESCRIPTION

Embodiments of the invention are generally directed to systems, methods, and apparatuses for optimizing the size of memory devices used for error correction code storage (e.g., an ECC device). A memory system may include a plurality of devices to store data and an ECC device. In some embodiments, the devices storing data have a density of N and the ECC device has a density of ½ N, where density is a positive value and is the capacity or size of a DIMM module or the capacity or size of each DRAM unit. In some embodiments, the addressing for the ECC device is remapped to account for its lower density.

Figure 1:
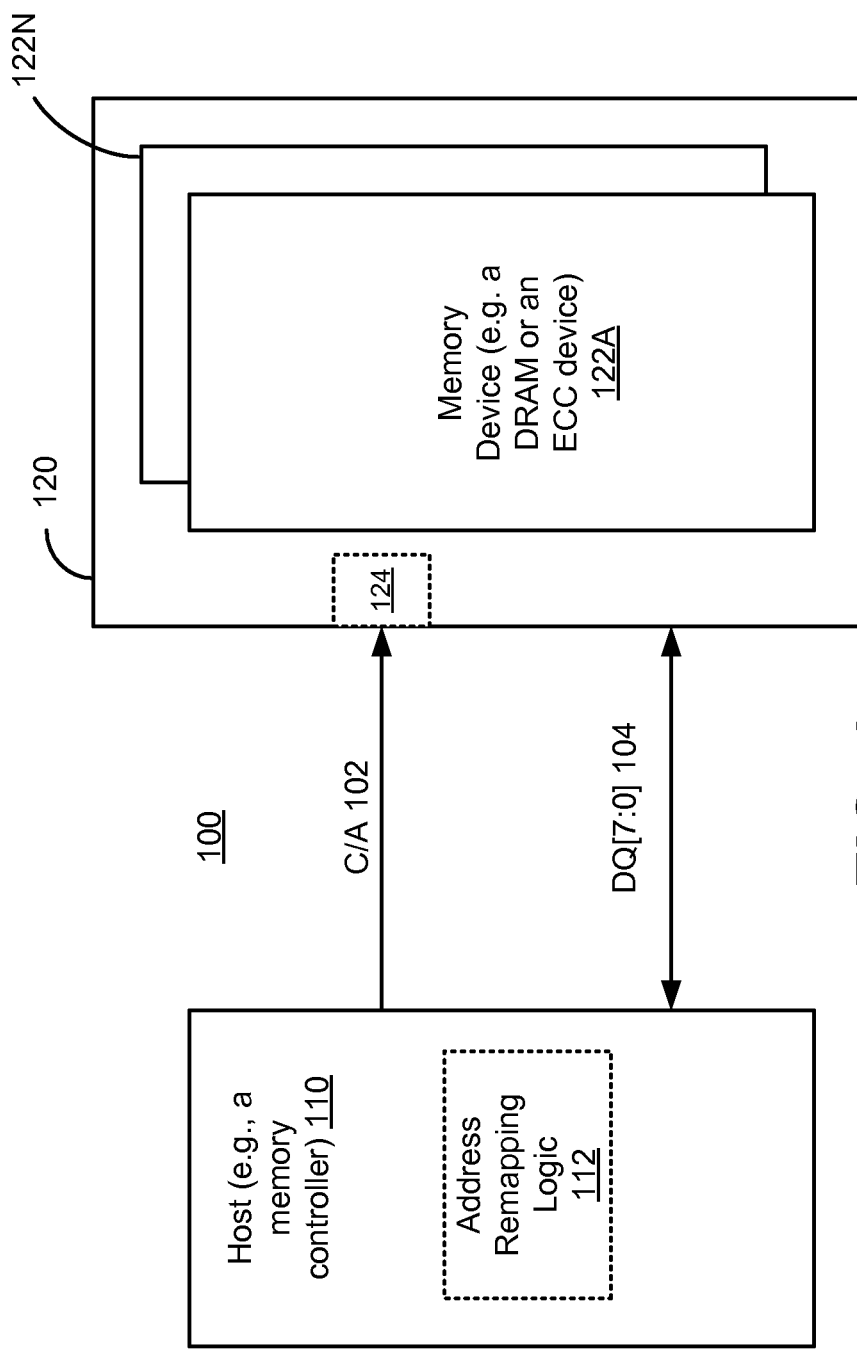
FIG. 1 is a high-level block diagram illustrating selected aspects of a computing system implemented according to an embodiment of the invention.

FIG. 1 is a high-level block diagram illustrating selected aspects of a computing system implemented according to an embodiment of the invention. In the illustrated embodiment, system 100 includes host 110 (e.g., a memory controller) and memory module 120. Host 110 may be, for example, a memory controller that is part of a chipset or integrated with a processor. Memory module 120 may be any of a wide range of memory modules including, for example, a dual inline memory module (DIMM), small outline (SO-DIMM), and the like. In alternative embodiments, system 100 may include more elements, fewer elements, and/or different elements.

Command/Address (C/A) lanes 102 provide a plurality of lanes for sending commands and addresses to memory device 120. DQ lanes 104 provide a bi-directional read/write data bus. In alternative embodiments, DQ lanes 104 may be uni-directional. In some embodiments, the interface may also include one or more cyclic redundancy code (CRC) lanes to convey CRC bits (e.g., to cover the data bits being transferred over DQ lanes 104). For ease of description, embodiments of the invention are described with reference to a system in which the memory devices storing data are x16 devices and the ECC device is a x8 memory device. It is to be appreciated, however, that embodiments of the invention may include devices having a wide variety of widths (e.g., x4, x8, x16, x32, x64, and the like).

Host 110 controls the transfer of data to and from memory module 120. In some embodiments, host 110 includes address remapping logic 112. As is further described below, in some embodiments, logic 112 drives a row address bit of C/A interconnect 102 to the same logic level as a bank group address bit of C/A interconnect 102.

Memory module 120 includes a plurality of memory devices 122 to provide (at least a portion of) main system memory for system 100. In some embodiments, memory devices 122 are dynamic random access memory devices (DRAMs). At least one of the memory devices 122 is an ECC device. The ECC device stores ECC bits to cover the data bits stored in the remaining memory devices 122. As is further described below, in some embodiments the ECC device is ½ the density of the other memory devices 122.

In some embodiments, memory module 120 includes routing logic 124. Routing logic 124 provides a mechanism for coupling a row address bit of C/A interconnect 102 to a bank group address pin of the ECC device (e.g., 122A). As used herein, the term "pin" broadly refers to an electrical contact suitable for coupling a signal from an interconnect to an integrated circuit (e.g., a pin, a pad, a ball, and the like).

Figure 2:
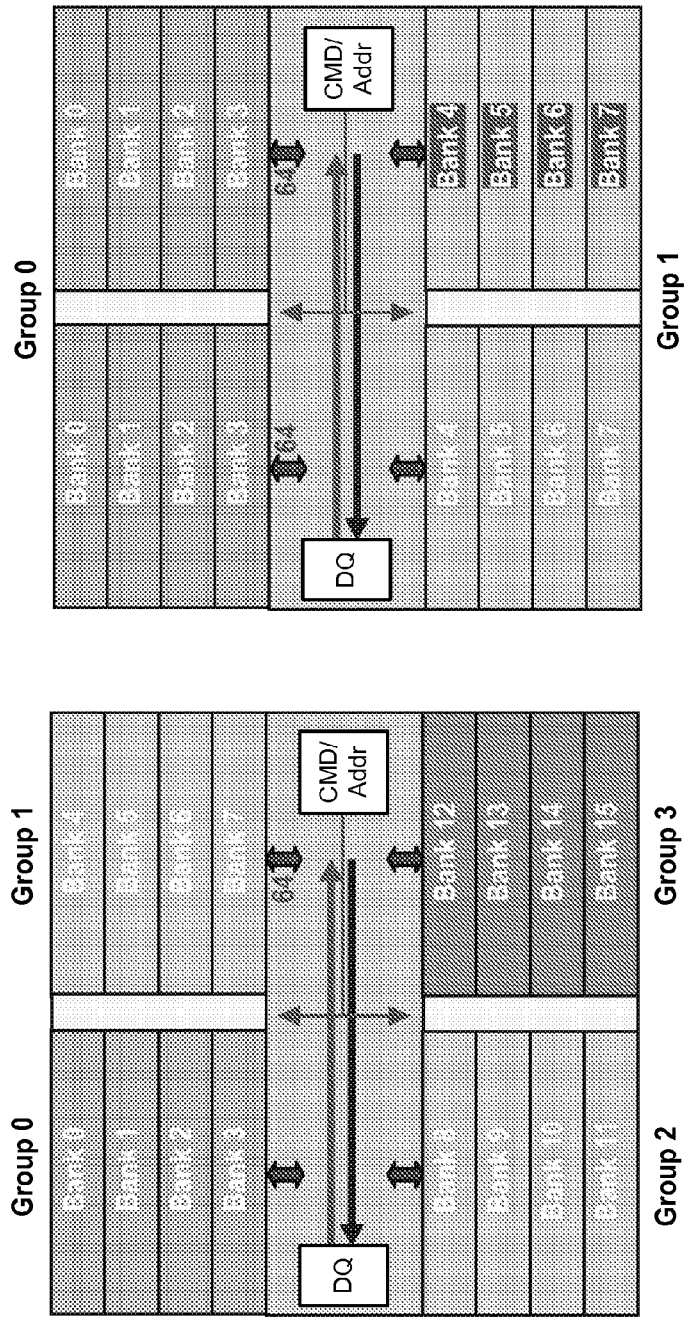
FIG. 2 is a block diagram illustrating selected aspects of the core architecture of x8 and x16 devices implemented according to an embodiment of the invention.

FIG. 2 is a block diagram illustrating selected aspects of the core architecture of x8 and x16 devices, according to an embodiment of the invention. System 200 includes x8 DRAM 210 and x16 DRAM 220. The x8 DRAM 210 is internally configured as a 16 bank memory device with 4 bank groups. In particular, it is configured to have banks 0-15 and bank groups 0-3. A bank group refers to a logical grouping of banks to provide greater concurrent operations in the core of the memory device. The x16 DRAM 220 is internally configured as an 8 bank device with two bank groups. In particular, it is configured to have banks 0-7 and bank groups 0-1. In some embodiments, a DRAM can be configured to be either a x8 device or a x16 device.

In the x16 mode (e.g., x16 DRAM 220), two word lines are activated in a bank group to provide a page size of 2K bytes. As shown in FIG. 2, the data is split across two bank halves in the array. Data from each half of the array is steered to the appropriate DQ pad. In some embodiments, 64 bits are accessed from each half of the array.

In x 8 mode (e.g., x8 DRAM 210), only one word line is activated and the banks are defined to not be split. A read from a bank takes the 64 bits from the bank and routes them to the appropriate pad. While the illustrated embodiment provides 64 bits of data from a x8 device and 128 bits of data from a x16 device, it is to be appreciated that in alternative embodiments, the number of bits provided may be different.

Table 2 provides addressing information for x8 and x16 1 Gbit devices according to an embodiment of the invention. The last column of Table 2 is for a x8 512 Mbit device. In alternative embodiments, the addressing information may be different.

TABLE 2

| Architecture | 128 Meg x8 (1 Gb) | 64 Meg x16 (1 Gb) | 64M x8 (512 Mb) |
|---|---|---|---|
| Banks(logical) | 16 | 8 | 16 |
| Bank Groups | 4 | 2 | 4 |
| Bank Addr | B0-B1 | B0-B1 | B0-B1 |
| Group Addr | G0-G1 | G0 | G0-G1 |
| Row Addr | (8K) R0-R12 | (8K) R0-R12 | (4K) R0-R11 |
| Column Addr | (1K) C3-C9 | (2K) C3-C9 | (1K) C3-C9 |

The bank group address bits shown in Table 2 are G0 and G1. B0 and B1 are the bank address bits. Similarly, R0-R12 are the row address bits. The column address bits are C3-C9 and they may be time multiplexed. In alternative embodiments, the number of bank group address bits, bank address bits, row address bits, and/or column address bits may be different.

In some embodiments, the ECC device is one density lower than the devices that store data. For example, if the devices that store data have a density of N, then the ECC device may have a density of ½ N. Since the ECC device has a different density than the other devices, addressing the ECC device may be different. The mechanism used to address the ECC device may depend, in part, on the topology of the address bus.

Three illustrative mechanisms for addressing the ECC device are provided below. The first mechanism includes physically coupling a row address bit of the address interconnect to a bank group address bit of the ECC device. In the second mechanism, a host drives a bank group address bit of the ECC device to the same logic level as a row address bit of the address interconnect. The third mechanism may be suitable for point-to-point topologies. In alternative embodiments, other mechanisms may be used for addressing an ECC device that is one density lower than the corresponding memory devices.

Address Remapping Mechanism 1

The first address remapping mechanism primarily applies to topologies in which the address interconnect serially links the memory devices (including the ECC device) in a daisy chain fashion (see, e.g., system 300, shown in FIG. 3). In such embodiments, the memory devices in a given rank typically see the same address because there is (typically) no special capability to address the ECC device as a unique device.

In some embodiments, the first address remapping mechanism includes mapping a row address bit of the address interconnect to a bank group address bit of the ECC device. In particular, a signal conductor that conveys a row address bit of the address interconnect may be coupled with an electrical contact meant to receive a bank group address bit on the ECC device.

FIG. 3 is a block diagram of a memory system illustrating selected aspects of the first remapping mechanism. System 300 includes host 302 and memory devices 304. Memory device 304-N is the ECC device for system 300. Address interconnect 306 is composed of one or more links (e.g., 306-1). Each link couples two elements of system 300 is a serial fashion. For example, link 306-1 couples host 302 with memory device 304-1. In system 300, all of the memory devices 304 of a given rank see the same address on address interconnect 306. In some embodiments, system 300 does not provide a special capability to uniquely address ECC device 304-N. In some embodiments, a row address bit (e.g., 310) of interconnect 306 is physically coupled with a bank group bit (e.g., 312) on ECC device 304-N.

In some alternative embodiments, the routing of the row address bit signal conductor to the bank group address bit electrical contact is implemented on the memory module. Referring to FIG. 1 as an example, routing logic 124 includes physically coupling a row address bit signal conductor of C/A interconnect 102 to a bank group address bit electrical contact on an ECC device of memory module 120.

In some embodiments, the row address bit is the most significant row address bit. Similarly, the bank group address bit is the most significant bank group address bit. For example, the row address bit may be R12 and the bank group address bit may be BG1. In alternative embodiments, a different row address bit (or bits) and/or a different bank group address bit (or bits) may be used.

The remapping of the row address bit allows a unique row on the ECC device (e.g., having a density of ½ N) to be mapped to a given row of a data device (e.g., having a density of N). This works well for core architectures where the N device has half the number of bank resources as the ½ N device. The ½ N device has half the number of rows so the number of row resources is equal for the N device and the ½ N device.

Figure 5:
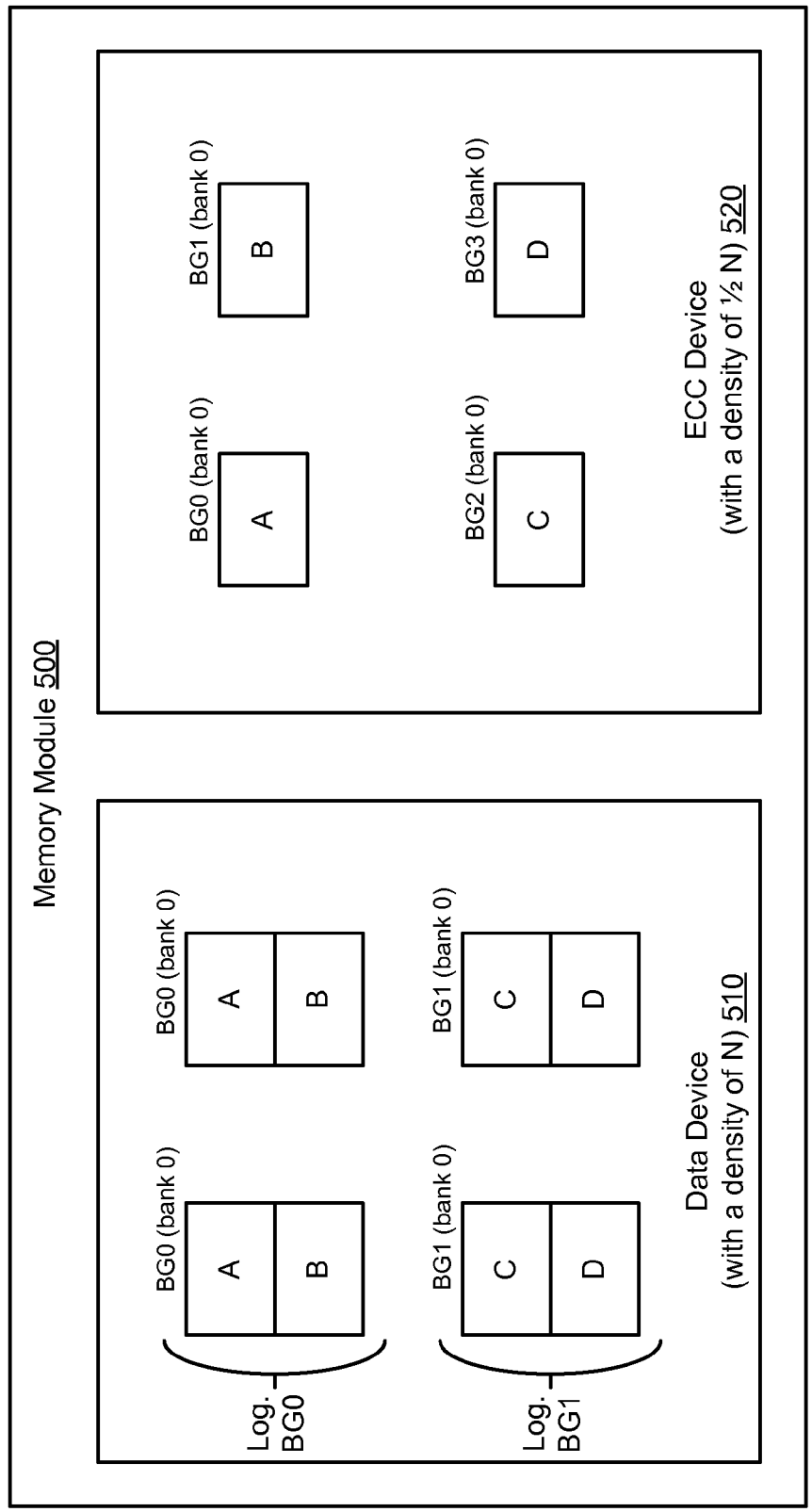
FIG. 5 is a block diagram illustrating selected aspects of address mapping for a bank according to an embodiment of the invention.

FIG. 5 is a block diagram illustrating selected aspects of address mapping for a bank according to an embodiment of the invention. Memory module 500 includes a number of memory devices (e.g., DRAMs) including data device 510 and ECC device 520. For ease of discussion, data device 510 is a x16 device and ECC device 520 is a x8 device with one-half the density of data device 510. It is to be appreciated, however, that in alternative embodiments, the data widths of the devices may be different.

For data device 510, logical bank 0 (G0) is spread across two physical banks in two different bank groups. The upper half of G0 is designated by the letter A. Similarly, the lower half of G0 is designated by the letter B. In some embodiments, the most significant row address bit selects between the upper half of the rows (e.g., region A) and the lower half of the rows (e.g., region B).

In some embodiments, the most significant row address bit of the address interconnect is coupled with the most significant bank group address bit of ECC device 520. For example, in the illustrated embodiment, R12 is coupled with BG1 on ECC device 520. Thus, the upper half of G0 on data device 510 is mapped to bank 0 (B0) of BG0 on ECC device 520. Similarly, the lower half of G0 on data device 510 is mapped to B0 of BG1 on ECC device 520. The address mapping shown in FIG. 5 is for illustrative purposes. It is to be appreciated that in alternative embodiments, the address mapping may be different.

Address Remapping Mechanism 2

In some embodiments, the second address remapping mechanism includes driving a bank group address bit to the same level as a row address bit. In particular, a host may include logic to drive a bank group address bit to the same logic level as the row address bit. FIG. 4 is a block diagram of a memory system illustrating selected aspects of the second remapping mechanism. System 400 includes host 402 and memory devices 404. Memory device 404-N is the ECC device for system 400. Address interconnect 406 is composed of one or more links (e.g., 406-1). Each link couples two elements of system 400 is a serial fashion.

In some embodiments, host 402 includes remapping logic 410. Remapping logic 410 drives a bank group address bit of ECC 404-N to the same logic level as one of the row address bits of interconnect 406. That is, remapping logic 410 drives the signal conductors that convey the bank group address bit and the row address bit to the same logic level.

In some embodiments, the row address bit is the most significant row address bit. Similarly, the bank group address bit is the most significant bank group address bit. For example, the row address bit may be R12 and the bank group address bit may be BG1. In alternative embodiments, a different row address bit (or bits) and/or a different bank group address bit (or bits) may be used.

The second address remapping mechanism is well suited to systems in which the data devices do not need all of the available bank group address bits to select among the bank groups. Consider data device 510, shown in FIG. 5, as an example. Data device 510 is logically divided into two bank groups: BG0 and BG1. One bank group address bit is sufficient to select between BG0 and BG1. Since there are two bank group address bits available in memory module 500, one of them can be a "no connect" or a "do not care" for data device 510.

Address Remapping Mechanism 3

Figure 6:
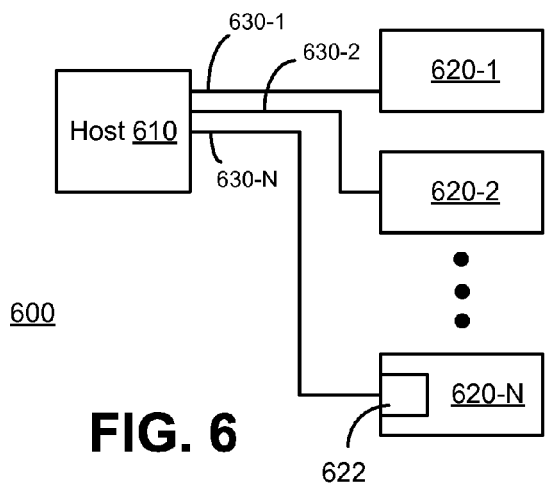
FIG. 6 is a block diagram illustrating selected aspects of an embodiment of the invention in which there are multiple address interconnects.

The third address remapping mechanism may be suitable, for example, for topologies in which each memory device has a separate address interconnect coupling it to the host. System 600, shown in FIG. 6, illustrates selected aspects of a memory system having this topology. System 600 includes host 610 and memory devices 620. Memory device 620-N is the ECC device for system 600. Each memory device 620 is coupled with host 610 via a separate address interconnect 630. For example, address interconnect 630-N separately couples ECC device 620-N to host 610.

In some embodiments, the third remapping mechanism includes routing a row address bit to a bank group address bit on the ECC device. For example, ECC device 622-N includes routing logic 622. Routing logic 622 provides a mechanism for coupling a row address bit of C/A interconnect 630-N to a bank group address pin of ECC device 620-N. As used herein, the term "pin" broadly refers to an electrical contact suitable for coupling a signal from an interconnect to an integrated circuit (e.g., a pin, a pad, a ball, and the like).

Figure 7:
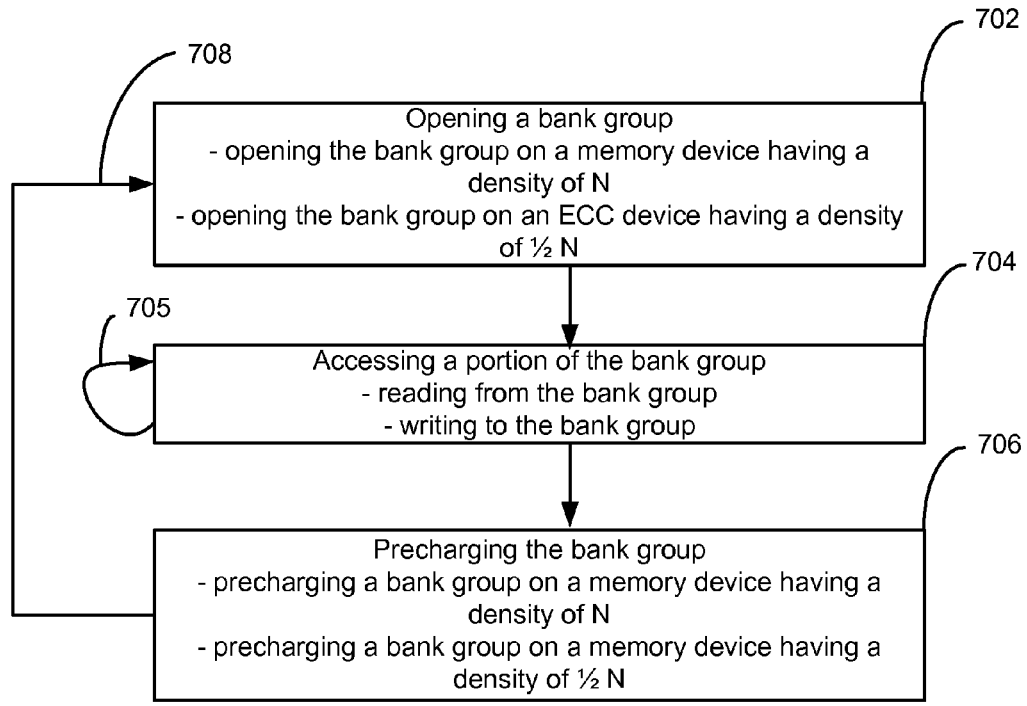
FIG. 7 is a flow diagram illustrating selected aspects of a method for accessing a memory system in which the devices storing data have a density of N and the device storing ECC has a density of ½ N.

FIG. 7 is a flow diagram illustrating selected aspects of a method for accessing a memory system in which the devices storing data have a density of N and the device storing ECC has a density of ½ N. Referring to process block 702, a host issues a command to open a bank group in a memory system (e.g., memory module 500, shown in FIG. 5). Opening a bank group may include both opening the bank group on one or more data devices and opening the bank group on a corresponding ECC device. Referring to FIG. 5, for example, a host may issue a command to open bank group 0 on memory module 500. In response, logical BG0 may be opened on data device 510 and BG0 may be opened on ECC device 520. In some embodiments, the data device has (or the data devices have) a density of N and the ECC device has a density of ½ N.

Referring again to FIG. 7, the host issues a command to access a portion of the open bank group. The term "access" refers to either a write operation or a read operation. During a write operation, data may be written to a data device having a density of N and ECC bits may be written to an ECC device having a density of ½ N. Similarly, during a read operation, data may read from a device having a density of N and corresponding ECC bits may be read from a device having a density of ½ N. Multiple reads and/or writes may be performed as shown by 705.

Referring to process block 706, a host issues a command to precharge the bank group. Precharging the bank group may include both precharging the bank group on one or more data devices (.e.g., having a density of N) and precharging the bank group on a corresponding ECC device (e.g., having a density of ½ N). The method shown in FIG. 7 may be repeated as shown by 708.

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

What is claimed is:

1. An apparatus comprising:
   an interconnect to convey address bits;
   a plurality of dynamic random access memory devices (DRAMs) coupled with the interconnect to store data, wherein each of the plurality of DRAMs has a DRAM density, where density refers to the storage capacity of the DRAM; and
   an error correction code (ECC) DRAM coupled with the interconnect to store ECC bits corresponding to the data, wherein the ECC DRAM has a density of that is one half of the DRAM density.

2. The apparatus of claim 1, wherein a row address bit of the interconnect is coupled with a bank group address bit of the ECC DRAM.

3. The apparatus of claim 2, wherein the row address bit is a most significant row address bit and the bank group address bit is a most significant bank group address bit.

4. The apparatus of claim 3, wherein the most significant row address bit is row address bit 12 (R12) and the most significant bank group address bit is bank group address bit 1 (BG1).

5. The apparatus of claim 1, wherein a row address bit of the interconnect is driven to the same logic level as a bank group address bit of the ECC DRAM.

6. The apparatus of claim 5, wherein the row address bit is a most significant row address bit and the bank group address bit is a most significant bank group address bit.

7. The apparatus of claim 6, wherein the most significant row address bit is row address bit 12 (R12) and the most significant bank group address bit is bank group address bit 1 (BG1).

8. The apparatus of claim 1, wherein the interconnect is coupled to the plurality of DRAMs and the ECC DRAM in a fly-by topology.

9. The apparatus of claim 1, wherein the interconnect is coupled to the plurality of DRAMs and the ECC DRAM in a point-to-point topology.

10. A method comprising:
    opening a bank group wherein opening the bank group includes
       opening the bank group on a memory device having a density, where density refers to the storage capacity, and
       opening the bank group on an error correction code (ECC) device having a density of one half of the memory device density; and
    accessing a portion of the bank group within the memory device.

11. The method of claim 10, wherein accessing the portion of the bank group comprises:
    providing an address on an interconnect, wherein the interconnect couples a host to the memory device and to the ECC device.

12. The method of claim 11, wherein a row address bit of the interconnect is coupled with a bank group address bit of the ECC device.

13. The method of claim 12, wherein the row address bit is a most significant row address bit and the bank group address bit is a most significant bank group address bit.

14. The method of claim 11, wherein a row address bit of the interconnect is driven to the same logic level as a bank group address bit of the ECC device.

15. The method of claim 14, wherein the row address bit is a most significant row address bit and the bank group address bit is a most significant bank group address bit.

16. A system comprising:
    a host; and
    a memory module coupled with the host, the memory module including,
       an interconnect,
       a plurality of volatile memory devices coupled with the interconnect to store data, wherein each of the plurality of volatile memory devices has a density, where density refers to the storage capacity; and
       an error correction code (ECC) device coupled with the interconnect to store ECC bits corresponding to the data, wherein the ECC device has a density of one half of the volatile memory device density.

17. The system of claim 16, wherein a row address bit of the interconnect is coupled with a bank group address bit of the ECC device.

18. The system of claim 17, wherein the row address bit is a most significant row address bit and the bank group address bit is a most significant bank group address bit.

19. The system of claim 18, wherein the host is to drive a row address bit of the interconnect to the same logic level as a bank group address bit of the ECC device.

20. The system of claim 18, wherein the row address bit is a most significant row address bit and the bank group address bit is a most significant bank group address bit.

* * * * *